United States Patent [19]

Oie et al.

[11] Patent Number: 5,688,628
[45] Date of Patent: Nov. 18, 1997

[54] RESIST COMPOSITION

[75] Inventors: Masayuki Oie, Toyama; Nobunori Abe, Kanagawa; Hideyuki Tanaka, Kanagawa; Akira Oikawa, Kanagawa; Shuichi Miyata, Kanagawa, all of Japan

[73] Assignee: Nippon Zeon Co., Ltd., Tokyo, Japan

[21] Appl. No.: 339,203

[22] Filed: Nov. 10, 1994

[30] Foreign Application Priority Data

Nov. 11, 1993 [JP] Japan ..................... 5-305935

[51] Int. Cl.⁶ ................. G03F 7/021; G03F 7/023
[52] U.S. Cl. ............... 430/176; 430/170; 430/191; 430/192; 430/270.1
[58] Field of Search .................... 430/176, 191, 430/192, 197, 270.1, 170

[56] References Cited

U.S. PATENT DOCUMENTS 4,491,628  1/1985  Ito et al. .................... 430/176
4,626,492  12/1986  Eilbeck ...................... 430/191
5,350,660  9/1994  Urano et al. ................. 430/176

FOREIGN PATENT DOCUMENTS 2-27660   6/1990  Japan.
3-107160  5/1991  Japan.

Primary Examiner—Christopher G. Young
Attorney, Agent, or Firm—Lowe, Price, LeBlanc & Becker

[57] ABSTRACT

A resist composition comprising in admixture (A) a compound which forms an acid upon exposure to active rays, (B) a polymer which has at least one structural unit with a group unstable to an acid and cleaves at this group in the presence of the acid derived from the compound (A) to turn alkali-soluble, and (C) a phenolic compound, and a process for forming a resist pattern using this resist composition are provided.

13 Claims, 1 Drawing Sheet

RESIST COMPOSITION

FIELD OF THE INVENTION

The present invention relates to a resist composition, and more particularly to a resist material which permits formation of patterns by exposure to ultraviolet radiation, KrF excimer laser beam or the like. This invention is also concerned with a process for forming a resist pattern. The resist composition according to the present invention is particularly suitable for use as a positive resist for minute processing of semiconductor elements.

BACKGROUND OF THE INVENTION

In order to form a minute pattern using a resist, a solution containing the resist is generally applied on the surface of a substrate, the substrate is dried to form a photosensitive film thereon, and the film is exposed to active rays so as to form a latent image. The latent image is then developed to form a negative or positive image. Resists are divided roughly into positive resists and negative resists. According to a positive resist, the solubility of an exposed area in a developer increases compared with that of an unexposed area to give a positive image. According to a negative resist on the other hand, the solubility of an exposed area decreases to give a negative image.

Upon fabrication of a semiconductor device by minute processing making use of a resist, a silicon wafer is used as a substrate to form an image (pattern) thereon by a lithography technique. After etching the silicon wafer by using, as a protective film, the resist remaining on the substrate, the remaining resist film is removed.

With the high integration, high density assembly and miniaturization of semiconductor elements toward IC, LSI and further VLSI, there has been a demand for a technique forming a minute pattern having a line width of 1 μm or less in recent years. It is however extremely difficult to form a minute pattern of 1 μm or less in line width with precision by the conventional photolithography technique making use of near ultraviolet radiation or visible radiation. Its yield is also lowered to a significant extent.

Therefore, in order to enhance the resolution of exposure, there have been studied other lithography techniques making use of far ultraviolet radiation, KrF excimer laser beam (radiation having a wavelength of 248 nm, which is emitted by a krypton fluoride laser) or the like, which has a shorter wavelength, instead of the conventional photolithography technique utilizing light (ultraviolet radiation having a wavelength of 350–450 nm).

Resist materials, which are central to such lithography techniques, are required to have a number of high properties. Among these properties, sensitivity, resolution, resistance to etching and storage stability are particularly important. However, resist materials developed heretofore do not sufficiently satisfy the performance of all these properties. There has hence been a strong demand for enhancement of the performance of such properties.

For example, a negative resist such as polyglycidyl methacrylate is high in sensitivity, but poor in resolution and resistance to dry etching. On the other hand, a positive resist such as polymethyl methacrylate is good in resolution, but poor in sensitivity and resistance to dry etching. Besides, when a positive photoresist of the novolak type, which has been used in exposure to ultraviolet radiation having a wavelength of 350–450 nm, is exposed to far ultraviolet radiation, a good minute pattern cannot be formed because the resist itself absorbs the far ultraviolet radiation to a great extent.

In recent years, attention has been paid to the high sensitization of a resist making use of an acid catalyst and a chemically amplified effect. For example, a resist for minute processing, which is composed of a three component system of (1) a base polymer, (2) a photo-induced acid generator (a compound which forms an acid upon exposure to active rays) and (3) an acid-sensitive substance (a compound which reacts in the presence of the acid as a catalyst, which has been generated by the exposure to the active rays, to change the solubility and the like of the base polymer), has been developed. This resist serves as a positive or negative resist by the reaction of the acid-sensitive substance in the presence of the acid as a catalyst, which has been generated by action of light, to change the solubility and the like of the base polymer. For example, a positive resist composed of a novolak resin, a photoacid generator and a dissolution inhibitor is known (Japanese Patent Application Laid-Open No. 107160/1991). The dissolution inhibitor has an effect to inhibit the dissolution of the novolak resin and reacts in the presence of an acid to exhibit a dissolution accelerating action. A positive resist of such a type that a functional group controlling the solubility of a base polymer is blocked in advance to insolubilize the base polymer, and the blocking is then taken off using, as a catalyst, an acid generated by the action of light to restore the solubility of the base polymer in a developer is also known.

There has recently been proposed a resist composition comprising a polymer containing recurring branched groups which consist of t-butyl carboxylate or phenol t-butyl carbonate and are unstable to an acid, and a photopolymerization initiator which generates an acid upon exposure to radiation (Japanese Patent Publication No. 27660/1990). When a film formed from this resist composition is exposed to ultraviolet radiation, electron beams or X-rays, the recurring branched groups, which are unstable to the acid, of the polymer exposed to the radiation cleave to form recurring groups having a polarity. As a result, a significant difference in solubility characteristics arises between the exposed area and the unexposed area of the polymer film. The exposed area is selectively removed by a treatment with an alkaline developer or a polar solvent. On the other hand, the unexposed area is selectively removed by a treatment with a non-polar solvent because of its nonpolarity. Therefore, this resist composition may serve as either a positive resist or a negative resist by selecting a developer.

However, when the resist composition proposed in Japanese Patent Publication No. 27660/1990 is used to conduct coating of resist, bake (heating treatment), exposure, post-exposure bake and development in accordance with the conventional resist process, thereby forming a resist pattern, the formation of a hardly-soluble layer is observed on the surface of the resist pattern, which offers a problem that so-called the T-shaped pattern is formed. In addition, when a suspension time between the exposure and the post-exposure bake is made long, a variation of sensitivity is recognized, and a thicker hardly-soluble layer is formed.

There has thus been a strong demand for development of a novel resist further improved in resist performance.

OBJECTS AND SUMMARY OF THE INVENTION

It is an object of the present invention to provide a resist material excellent in resist properties such as sensitivity, resolution, resistance to etching, storage stability and process latitude.

3

Another object of the present invention is to provide a resist material suitable for use in lithography making use of far ultraviolet radiation or KrF excimer laser beam which is short in wavelength.

A further object of the present invention is to provide a resist composition particularly suitable for use as a positive resist for minute processing of semiconductor elements.

A still further object of the present invention is to provide a process for forming a resist pattern excellent in pattern form.

The present inventors have carried out an extensive investigation with a view toward solving the above-described problems involved in the prior art. As a result, it has been found that when a photoacid generator, a polymer having at least one structural unit with a group unstable to an acid (acid-unstable group), and a phenolic compound are combined with one another, a resist composition capable of preventing the formation of a hardly-soluble layer on the surface of a resist pattern formed from the resist composition and excellent in resist properties can be obtained. The resist composition may further contain an alkali-soluble phenolic resin.

The resist composition according to the present invention is a chemical amplified resist. When the resist composition according to the present invention is used to form a resist pattern, the formation of a hardly-soluble layer on the surface of the resist pattern can be prevented, and so the sectional form of patterned lines is improved.

The present invention has been led to completion on the basis of this finding.

According to the present invention, there is thus provided a resist composition comprising in admixture (A) a compound which forms an acid upon exposure to active rays, (B) a polymer which has at least one structural unit with a group unstable to an acid and cleaves at this group in the presence of the acid derived from the compound (A) to turn alkali-soluble, and (C) a phenolic compound.

According to the present invention, there is also provided a process for forming a resist pattern, comprising the steps of coating of a chemically amplified resist to a substrate, the first heating treatment, exposure, the second heating treatment and development in order, wherein the resist composition described above is used as the chemically amplified resist.

DETAILED DESCRIPTION OF THE INVENTION

Figure 1:
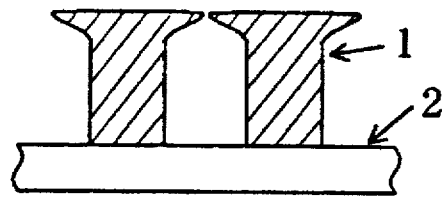
FIG. 1 is a typical cross-sectional view illustrating patterned lines of a resist layer formed in Comparative Example 1.

Features of the present invention will hereinafter be described in detail.

4

(A) Photoacid generator:

No particular limitation is imposed on the compound, which forms an acid upon exposure to active rays (photoacid generator), useful in the practice of the present invention so far as it is a substance which generates a Brønsted acid or Lewis acid upon exposure to active rays. A variety of known compounds and mixtures may be used. Examples thereof include onium salts, halogenated organic compounds, quinonediazide compounds, $\alpha,\alpha'$-bis(sulfonyl) diazomethane compounds, $\alpha$-carbonyl-$\alpha'$-sulfonyl-diazomethane compounds, sulfone compounds, organic acid ester compounds, organic acid amide compounds and organic acid imide compounds.

As specific examples of the onium salts, may be mentioned diazonium salts, ammonium salts, iodonium salts, sulfonium salts, phosphonium salts, arsonium salts and oxonium salts, which each have an unsubstituted, or symmetrically or unsymmetrically substituted alkyl, alkenyl, aralkyl, aromatic or heterocyclic group. No particular limitation is imposed on compounds forming counter anions to these onium salts so far as they can form the counter anions. However, examples thereof include boric acid, arsenic acid, phosphoric acid, antihmonic acid, sulfonic acid, carboxylic acids and halides thereof.

No particular limitation is imposed on the halogenated organic compounds so far as they are halides of organic compounds. A variety of known compound may be used. As specific examples of the halogenated organic compounds, may be mentioned halogen-containing oxadiazole compounds, halogen-containing triazine compounds, halogen-containing acetophenone compounds, halogen-containing benzophenone compounds, halogen-containing sulfoxide compounds, halogen-containing sulfone compounds, halogen-containing thiazole compounds, halogen-containing oxazole compounds, halogen-containing triazole compounds, halogen-containing 2-pyrrone compounds, halogen-containing aliphatic hydrocarbon compounds, halogen-containing aromatic hydrocarbon compounds, halogen-containing heterocyclic compounds other than those mentioned above and sulfenyl halide compounds.

As further exemplary halogenated organic compounds, may be mentioned halogen-containing flame retardants such as tris(2,3-dibromopropyl) phosphate, tris(2,3-dibromo-3-chloropropyl) phosphate, chlorotetrabromobutane, hexachlorobenzene, hexabromobenzene, hexabromocyclododecane, hexabromobiphenyl, tribromophenyl allyl ether, tetrachlorobisphenol A, tetrabromobisphenol A, bis(bromoethyl ether) tetrabromobisphenol A, bis(chloroethyl ether) tetrabromobisphenol A, tris(2,3-dibromopropyl) isocyanurate, 2,2-bis(4-hydroxy-3,5-dibromophenyl)propane and 2,2-bis(4-hydroxyethoxy-3,5-dibromophenyl)propane; and halogen-containing organochloric pesticides, such as dichlorodiphenyltrichloroethane, benzene hexachloride, pentachlorophenol, 2,4,6-trichlorophenyl 4-nitrophenyl ether, 2,4-dichlorophenyl 3'-methoxy-4'-nitrophenyl ether, 2,4-dichlorophenoxyacetic acid, 4,5,6,7-tetrachlorophthalide, 1,1-bis(4-chlorophenyl)ethanol, 1,1-bis(4-chlorophenyl)-2,2,2-trichloroethanol, ethyl 4,4-dichlorobenzilate, 2,4,5,4'-tetrachlorodiphenyl sulfide and 2,4,5,4'-tetrachlorodiphenyl sulfone.

As specific examples of the quinonediazide compounds, may be mentioned 1,2-benzoquinonediazide-4-sulfonic acid ester, 1,2-naphthoquinonediazide-4-sulfonic acid ester, 1,2-naphthoquinonediazide-5-sulfonic acid ester, 1,2-naphthoquinonediazide-6-sulfonic acid ester, 2,1- naphthoquinonediazide-4-sulfonic acid ester, 2,1-naphthoquinonediazide-5-sulfonic acid ester, 2,1-naphthoquinonediazide-6-sulfonic acid ester and sulfonic acid esters of other quinonediazide derivatives; and 1,2-benzoquinonediazide-4-sulfonic acid chloride, 1,2-naphthoquinonediazide-4-sulfonic acid chloride, 1,2-naphthoquinonediazide-5-sulfonic acid chloride, 1,2-naphthoquinonediazide-6-sulfonic acid chloride, 2,1-naphthoquinonediazide-4-sulfonic acid chloride, 2,1-naphthoquinonediazide-5-sulfonic acid chloride, 2,1-naphthoquinonediazide-6-sulfonic acid chloride and sulfonic acid chlorides of other quinonediazide derivatives.

Specific examples of the α,α'-bis(sulfonyl)diazomethane compounds include α,α'-bis(sulfonyl)diazomethanes, which each have an unsubstituted, or symmetrically or unsymmetrically substituted alkyl, alkenyl, aralkyl, aromatic or heterocyclic group.

Specific examples of the α-carbonyl-α'-sulfonyldiazomethane compounds include α-carbonyl-α'-sulfonyldiazomethanes, which each have an unsubstituted, or symmetrically or unsymmetrically substituted alkyl, alkenyl, aralkyl, aromatic or heterocyclic group.

Specific examples of the sulfone compounds include sulfone compounds and disulfone compounds, which each have an unsubstituted, or symmetrically or unsymmetrically substituted alkyl, alkenyl, aralkyl, aromatic or heterocyclic group.

Specific examples of the organic acid esters include carboxylic acid esters and sulfonic acid esters, which each have an unsubstituted, or symmetrically or unsymmetrically substituted alkyl, alkenyl, aralkyl, aromatic or heterocyclic group.

Specific examples of the organic acid amides include carboxylic acid amides and sulfonic acid amides, which each have an unsubstituted, or symmetrically or unsymmetrically substituted alkyl, alkenyl, aralkyl, aromatic or heterocyclic group.

Specific examples of the organic acid imides include carboxylic acid imides and sulfonic acid imides, which each have an unsubstituted, or symmetrically or unsymmetrically substituted alkyl, alkenyl, aralkyl, aromatic or heterocyclic group.

These compounds which forms an acid upon exposure to active rays may be used either singly or in any combination thereof.

The proportion of the compound (A) which forms an acid upon exposure to active rays is generally 0.01–50 parts by weight, preferably 0.2–20 parts by weight per 100 parts by weight of the polymer (B) having at least one structural unit with an acid-unstable group. Proportions lower than 0.01 part by weight result in a resist composition substantially impossible to form any pattern. On the other hand, proportions exceeding 50 parts by weight result in a resist composition showing a tendency to cause the insolubilization of the exposed area upon development. Such a low or high proportion is hence disadvantageous from the viewpoint of resist performance.

(B) Polymer having structural unit(s) with an acid-unstable group:

No particular limitation is imposed on the polymer (B) useful in the practice of the present invention so far as it has at least one structural unit with a group unstable to an acid and cleaves at the acid-unstable group to turn alkali-soluble.

As examples of such polymers, may be mentioned polymers having a structural unit represented by the following general formula (I), (II) or (III). The polymer (B) has one or more of these structural units, or may be a copolymer having at least one of these structural units and one or more other structural units. Structural unit (I):

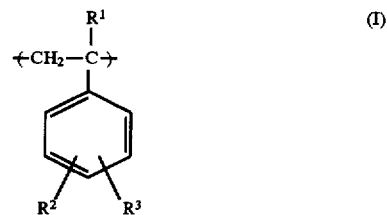

wherein $R^1$ and $R^2$ are identical with or different from each other, and mean individually a hydrogen atom, a halogen atom, a cyano group, an alkyl group having 1–5 carbon atoms or a substituted alkyl group having 1–2 carbon atoms, and $R^3$ denotes a linear acetal group, a cyclic acetal group, a carbonate group or $-OR^9$, in which $R^9$ is

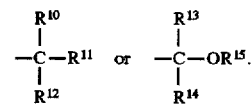

In these formulae, $R^{10}$, $R^{11}$, $R^{12}$, $R^{13}$, $R^{14}$ and $R^{15}$ are independently selected from linear alkyl groups, substituted linear alkyl groups, branched alkyl groups, substituted branched alkyl groups, cycloalkyl groups, substituted cycloalkyl groups, alkenyl groups, substituted alkenyl groups, aryl groups, substituted aryl groups, aralkyl groups and substituted aralkyl groups. Of these groups, $R^{13}$ and $R^{14}$ may each be a hydrogen atom. Structural unit (II):

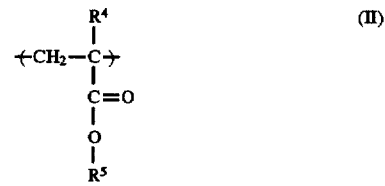

wherein $R^4$ means a hydrogen atom, a halogen atom, a cyano group, an alkyl group having 1–5 carbon atoms or a substituted alkyl group having 1–5 carbon atoms, and $R^5$ is

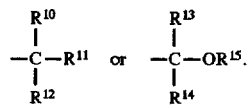

In these formulae, $R^{10}$, $R^{11}$, $R^{12}$, $R^{13}$, $R^{14}$ and $R^{15}$ are independently selected from linear alkyl groups, substituted linear alkyl groups, branched alkyl groups, substituted branched alkyl groups, cycloalkyl groups, substituted cycloalkyl groups, alkenyl groups, substituted alkenyl groups, aryl groups, substituted aryl groups, aralkyl groups and substituted aralkyl groups. Of these groups, $R^{13}$ and $R^{14}$ may each be a hydrogen atom. Structural unit (III):

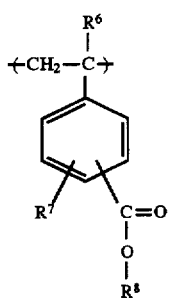
(III)

halogen atom, a cyano group, an alkyl group having 1–5 carbon atoms or a substituted alkyl group having 1–5 carbon atoms, and $R^8$ is

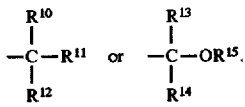

In these formulae, $R^{10}$, $R^{11}$, $R^{12}$, $R^{13}$, $R^{14}$ and $R^{15}$ are independently selected from linear alkyl groups, substituted linear alkyl groups, branched alkyl groups, substituted branched alkyl groups, cycloalkyl groups, substituted cycloalkyl groups, alkenyl groups, substituted alkenyl groups, aryl groups, substituted aryl groups, aralkyl groups and substituted aralkyl groups. Of these groups, $R^{13}$ and $R^{14}$ may each be a hydrogen atom.

In these general formulae, examples of the substituted alkyl group having 1–5 carbon atoms may include alkyl groups having a halogen atom as a substituent. Examples of the linear acetal group, the cyclic acetal group and the carbonate group may include linear acetal groups having 2–16 carbon atoms, cyclic acetal groups having 3–17 carbon atoms and carbonate group having 2–15 carbon atoms, respectively.

In $R^{10}$, $R^{11}$, $R^{12}$, $R^{13}$, $R^{14}$ and $R^{15}$,
(1) the linear alkyl groups may preferably be linear alkyl groups having 1–5 carbon atoms,
(2) the substituted linear alkyl groups may preferably be substituted linear alkyl groups having 1–5 carbon atoms and, for example, a halogen atom as a substituent,
(3) the branched alkyl groups may preferably be branched alkyl groups having 3–8 carbon atoms,
(4) the substituted branched alkyl groups may preferably be substituted branched alkyl groups having 3–8 carbon atoms and, for example, a halogen atom as a substituent,
(5) the cycloalkyl groups may preferably be cycloalkyl groups having 5–16 carbon atoms,
(6) the substituted cycloalkyl groups may preferably be substituted cycloalkyl groups having 5–16 carbon atoms and, for example, a halogen atom as a substituent,.
(7) the alkenyl groups may preferably be alkenyl groups having 2–7 carbon atoms,
(8) the substituted alkenyl groups may preferably be substituted alkenyl groups having 2–7 carbon atoms and, for example, a halogen atom as a substituent,
(9) the aryl groups may preferably be aryl groups having 6–16 carbon atoms,
(10) the substituted aryl groups may preferably be substituted aryl groups having 6–16 carbon atoms and, for example, a halogen atom or a nitro group as a substituent,
(11) the aralkyl groups may preferably be aralkyl groups having 7–16 carbon atoms, and
(12) the substituted aralkyl groups may preferably be substituted aralkyl groups having 7–16 carbon atoms and, for example, a halogen atom or a nitro group as a substituent.

As examples of a process for obtaining the polymer (B) having at least one of these structural units, may be mentioned a process in which individual monomers capable of giving the structural unit of the general formula (I), (II) or (III) are (co)polymerized, and a process in which a (co)polymer having at least one of these structural units is formed by a polymer reaction.

The monomers capable of giving the structural unit of the general formula (I) are compounds represented by the general formula (IV):

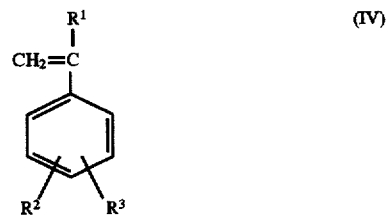
(IV)

wherein $R^1$, $R^2$ and $R^3$ have the same meaning as define in the general formula (I).

As specific examples of the compounds represented by the general formula (IV), may be mentioned the following compounds:

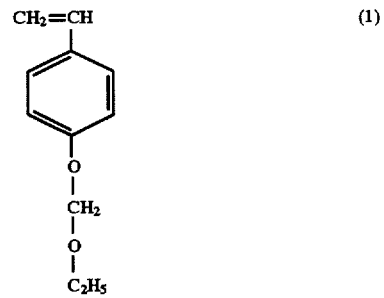
(1)

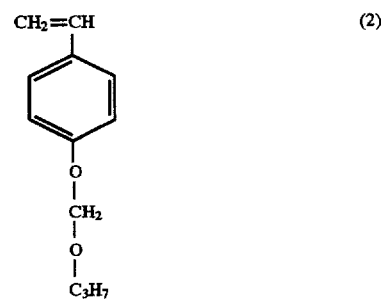
(2)

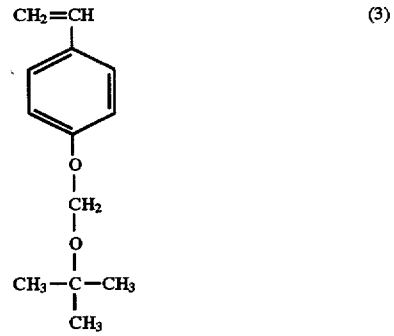
(3)

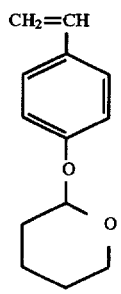 (4)
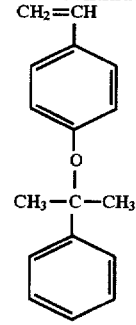 (9)
(5)
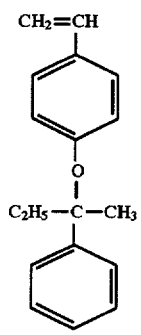 (10)
(6)
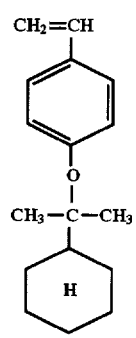 (11)
(7)
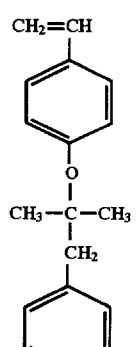 (12)
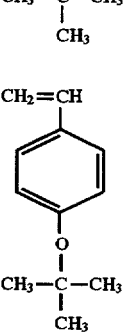 (8)
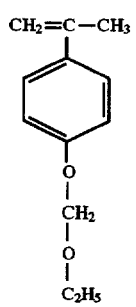 (13)

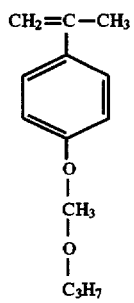 (14)
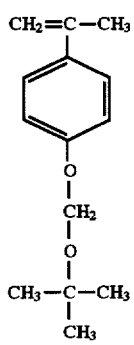 (15)
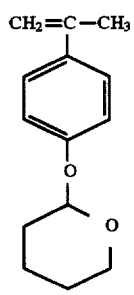 (16)
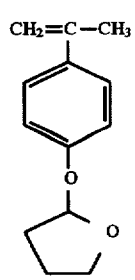 (17)
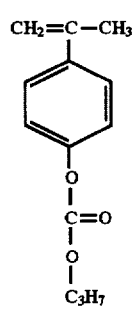 (18)
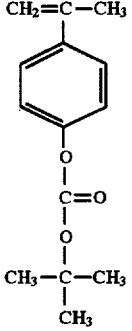 (19)
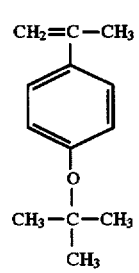 (20)
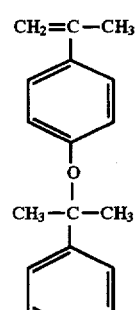 (21)
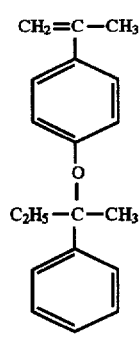 (22)
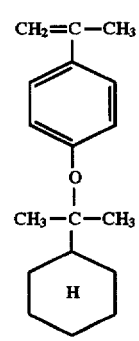 (23)

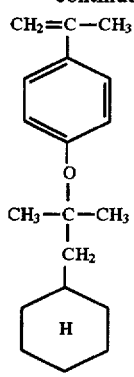 (24)

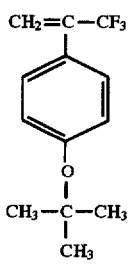 (25)

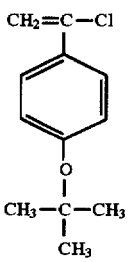 (26)

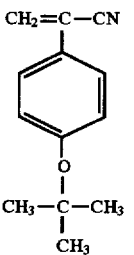 (27)

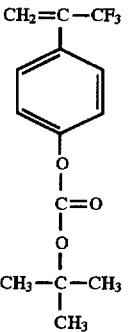 (28)

 (29)

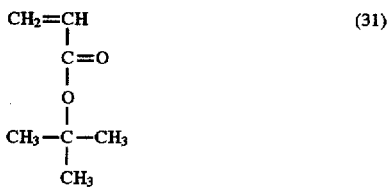 (30)

The monomers capable of giving the structural unit of the general formula (II) are compounds represented by the general formula (V):

$$CH_2=C\underset{\underset{R^5}{\overset{|}{O}}}{\overset{\overset{R^4}{|}}{\underset{}{\overset{}{-}}}}C=O \quad (V)$$

wherein $R^4$ and $R^5$ have the same meaning as define in the general formula (II).

As specific examples of the compounds represented by the general formula (V), may be mentioned the following compounds:

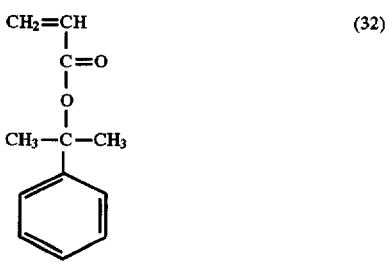

(31)

(32)

-continued
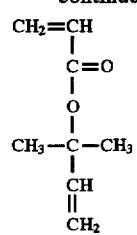 (33)
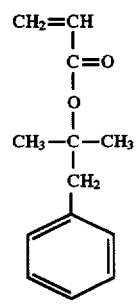 (34)
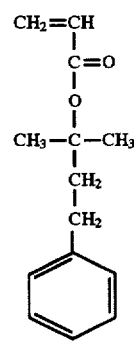 (35)
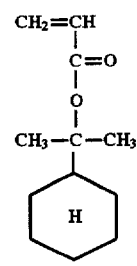 (36)
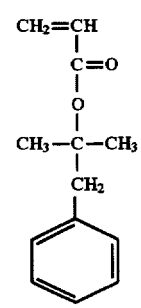 (37)
-continued
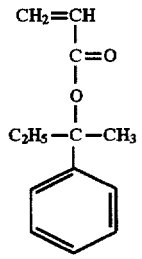 (38)
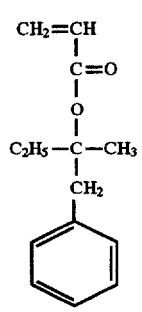 (39)
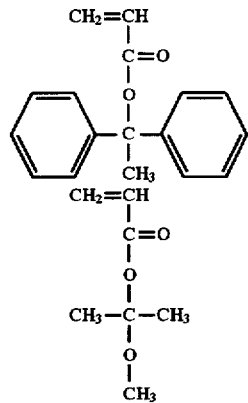 (40)
(41)
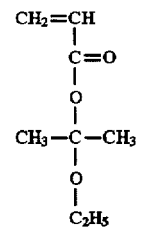 (42)
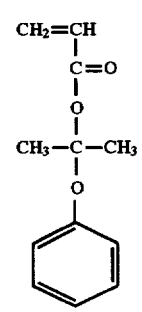 (43)

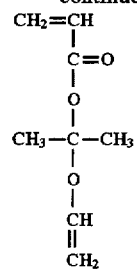 (44)
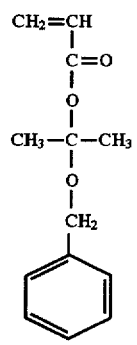 (45)
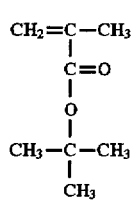 (46)
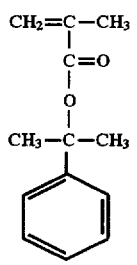 (47)
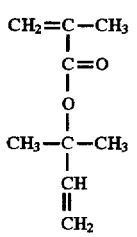 (48)
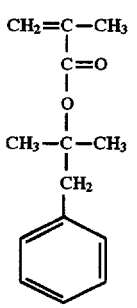 (49)
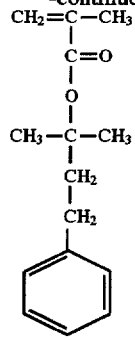 (50)
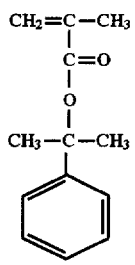 (51)
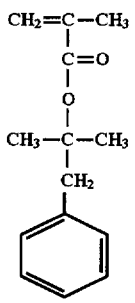 (52)
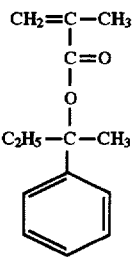 (53)
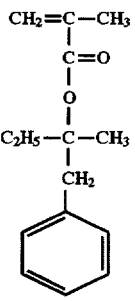 (54)
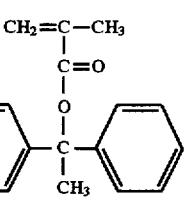 (55)

-continued
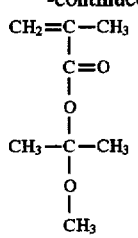 (56)
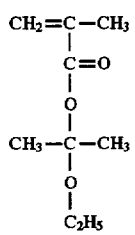 (57)
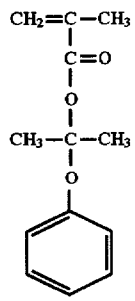 (58)
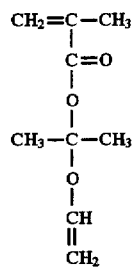 (59)
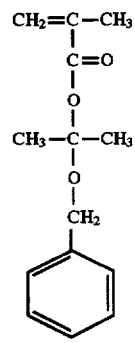 (60)
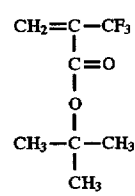 (61)
-continued
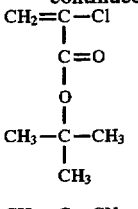 (62)
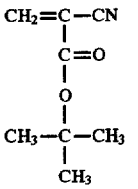 (63)
The monomers capable of giving the structural unit of the general formula (III) are compounds represented by the general formula (VI):
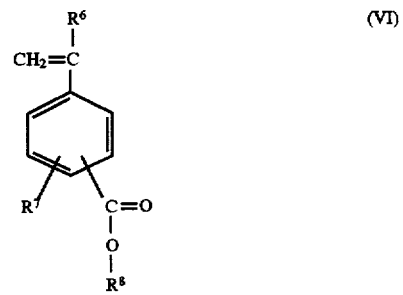 (VI)
wherein $R^6$, $R^7$ and $R^8$ have the same meaning as define in the general formula (III).
As specific examples of the compounds represented by the general formula (VI), may be mentioned the following compounds:
 (64)
 (65)

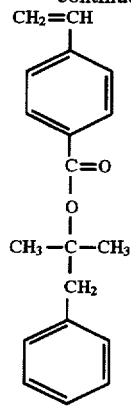 (66)
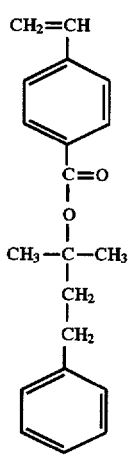 (67)
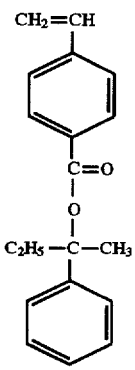 (68)
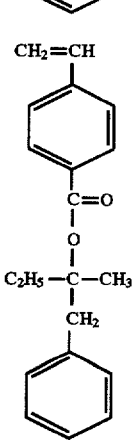 (69)
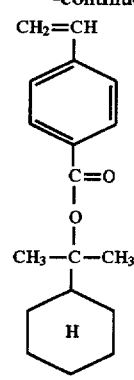 (70)
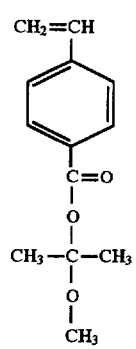 (71)
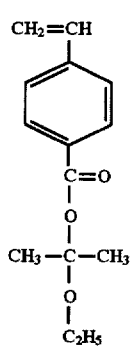 (72)
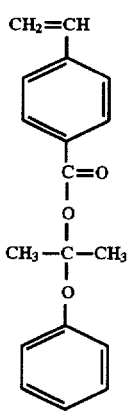 (73)

-continued
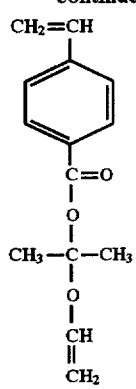 (74)
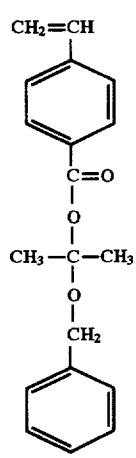 (75)
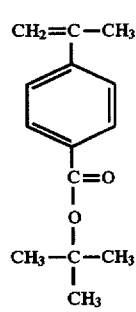 (76)
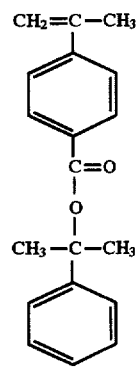 (77)
-continued
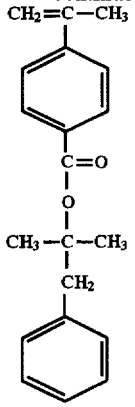 (78)
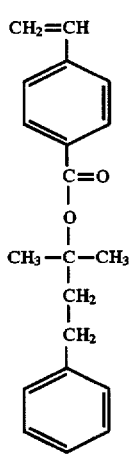 (79)
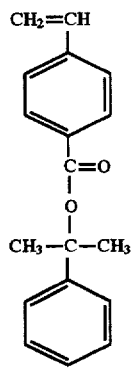 (80)
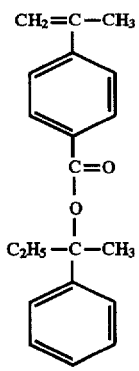 (81)

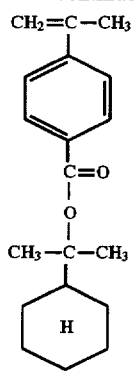 (82)
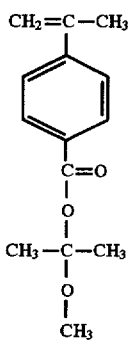 (83)
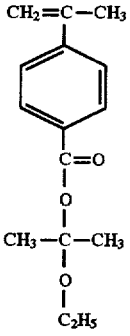 (84)
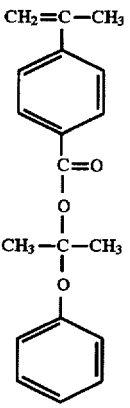 (85)
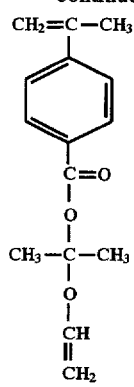 (86)
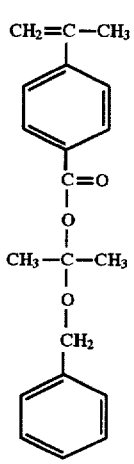 (87)
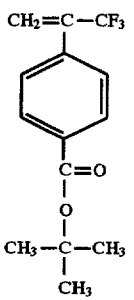 (88)
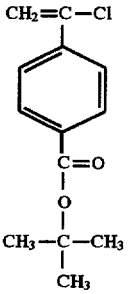 (89)

-continued

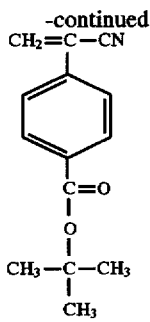
(90)

The polymer (B) useful in the practice of the present invention may be a copolymer containing, as a comonomer component, other monomer(s) copolymerizable with the above-described monomers.

No particular limitation is imposed on the other monomers so far as they are monomers copolymerizable with the above-described monomers. However, as specific examples thereof, may be mentioned styrene compounds such as styrene, 4-hydroxystyrene, 2-hydroxystyrene, 4-chlorostyrene, 2-chlorostyrene, 2,3-dichlorostyrene, 4-bromostyrene, 2-bromostyrene, 4-iodostyrene, 2-iodostyrene, 4-carboxystyrene, 4-methylstyrene, α-methylstyrene, α-methyl-4-hydroxystyrene, α-methyl-2-hydroxystyrene, α-methyl-4-carboxystyrene, α-methyl-4-methylstyrene, α-methyl-4-chlorostyrene, α-trifluoromethylstyrene, α-trichloromethylstyrene, α-chlorostyrene, α-bromostyrene and α-cyanostyrene; acrylic compounds such as acrylic acid, methyl acrylate, ethyl acrylate, propyl acrylate, glycidyl acrylate, cyclohexyl acrylate, phenyl acrylate, benzyl acrylate, t-butylphenyl acrylate, cyclopentenyl acrylate, cyclopentanyl acrylate, dicyclopentenyl acrylate, isobornyl acrylate, adamantyl acrylate and dimethyladamantyl acrylate; methacrylic compounds such as methacrylic acid, methyl methacrylate, ethyl methacrylate, propyl methacrylate, glycidyl methacrylate, cyclohexyl methacrylate, phenyl methacrylate, benzyl methacrylate, t-butylphenyl methacrylate, cyclopentenyl methacrylate, cyclopentanyl methacrylate, dicyclopentenyl methacrylate, isobornyl methacrylate, adamantyl methacrylate and dimethyladamantyl methacrylate; acrylic amide compounds such as acrylic amide and derivatives thereof; methacrylic amide compounds such as methacrylic amide and derivatives thereof; maleic compounds such as maleic acid and derivatives thereof; maleic anhydride compounds such as maleic anhydride and derivatives thereof; vinyl acetate; vinylpyrrolidine; acrylonitrile; fumaronitrile; vinylpyrrolidone and vinylcarbazole.

The other copolymerizable monomers may be copolymerized within limits not impeding alkali developability (in an amount of generally 0–80 mol %, preferably 20–70 mol %, more preferably 30–60 mol %).

The copolymer according to the present invention may be obtained in accordance with a process known per se in the art, such as radical polymerization or ionic polymerization, and may preferably have a weight average molecular weight ranging from 1,000 to 1,000,000.

(C) Phenolic compound:

The phenolic compound useful in the practice of the present invention is phenol or a derivative thereof. No particular limitation is imposed thereon so far as it is a compound having a monohydric or polyhydric phenolic skeleton.

As specific examples of the phenolic compound, may be mentioned phenols such as phenol, cresol, xylenol, ethylphenol, propylphenol, butylphenol, amylphenol, octylphenol, cumylphenol, pyrocatechol, resorcin, pyrogallol and phloroglucinol, and derivatives thereof; bisphenols such as bisphenol A, bisphenol AF, bisphenol AP, hisphenol B, bisphenol BP, bisphenol E, hisphenol F, hisphenol ACB, bisphenol LV, bisphenol S, bisphenol Z, bisphenol P, bisphenol M and bisphenol fluorenone dihydroxydiphenyl ether, and derivatives thereof; trisphenols such as trisphenol PA, trisphenol TC, trisphenol HAP and trishydroxyphenylmethane, and derivative thereof; tetrakisphenols such as tetrakisphenolethane and tetrakisphenolterephthalaldehyde, and derivatives thereof; hydroxybenzophenones such as 2-hydroxybenzophenone, 3-hydroxybenzophenone, 4-hydroxybenzophenone, 2,2'-dihydroxybenzophenone, 2,4-dihydroxybenzophenone, 4,4'-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,3,4,2',4'-pentahydroxybenzophenone and 2,3,4,3',4',5'-hexahydroxybenzophenone, and derivatives thereof; hydroxybiphenyls such as hydroxybiphenyl and dihydroxybiphenyl, and derivatives thereof; hydroxybenzophenone oximes and derivatives thereof; hydroxybenzotriazoles and derivatives thereof; hydroxyacetophenones and derivatives thereof; gallic acid and derivatives thereof; hydroxystyrenes, hydroxystyrene oligomers and derivatives thereof; hydroxy-α-methylstyrenes, hydroxy-α-methylstyrene oligomers and derivatives thereof; novolak oligomers and derivatives thereof; chromones such as eugenin, eugenitin and flavin, and derivatives thereof; flavones such as chrysin, primetin, apigenin, baicalein and luteolin, and derivatives thereof; flavonols such as morin, kaempferol, galangin, fisetin, robinetin and herbacetin, and derivatives thereof; flavanones such as liquiritigenin, butin, eriodictyol and isocarthamidin, and derivatives thereof; oxyflavanones such as fustin, katuranin and distylin, and derivatives thereof; isoflavans such as phelleilin, and derivatives thereof; chromans such as tocopherol and equol, and derivatives thereof; catechins and derivatives thereof; spirobichromans and derivatives thereof; nitrophenols such as 2-nitrophenol, 3-nitrophenol, 4-nitrophenol, 2,3dinitrophenol, 2,4-dinitrophenol, 2,5-dinitrophenol, 2,6-dinitrophenol, 3,4-dinitrophenol and 3,5-dinitrophenol, and derivatives thereof; cyanophenols such as 2-cyanophenol, 3-cyanophenol and 4-cyanophenol, and derivatives thereof; alkoxyphenols such as 2methoxyphenol, 3-methoxyphenol, 4-methoxyphenol, 2,6-dimethoxyphenol, 3,5-dimethoxyphenol and 4-ethoxy-phenol, and derivatives thereof; and halogenated phenols such as 2-chlorophenol, 3-chlorophenol, 4-chlorophenol, 2,3-dichlorophenol, 2,4-dichlorophenol, 2,5-dichlorophenol, 2,6-dichlorophenol, 3,4-dichlorophenol, 3,5-dichlorophenol, 2-fluorophenol, 4-fluorophenol, 2-bromophenol and 4-bromophenol, and derivatives thereof.

The proportion of the phenolic compound (C) used in the present invention is generally 0.01–100 parts by weight, preferably 0.1–20 parts by weight per 100 parts by weight of the polymer (B) having at least one structural unit with an acid-unstable group. Proportions lower than 0.01 part by weight result in a resist composition insufficient in the improving effect by the addition of the phenolic compound. On the other hand, proportions exceeding 100 parts by weight result in a resist composition by which reduction in the rate of residual film is recognized, and the formation of a resist pattern is difficult.

(Resist composition)

The resist composition according to the present invention is generally used in a state that it is dissolved in a solvent in order to apply it on a substrate to form a resist film.

As exemplary solvents, may be mentioned ketones such as acetone, methyl ethyl ketone, cyclohexanone, cyclopentanone and cycloheptanone; alcohols such as n-propyl alcohol, isopropyl alcohol, n-butyl alcohol and t-butyl alcohol; ethers such as ethylene glycol dimethyl ether, ethylene glycol diethyl ether and dioxane; alcohol ethers such as ethylene glycol monomethyl ether, ethylene glycol monoethyl ether, propylene glycol monomethyl ether and propylene glycol monoethyl ether; esters such as propyl formate, butyl formate, propyl acetate, butyl acetate, methyl propionate, ethyl propionate, methyl butyrate, ethyl butyrate and butyrolactone; monohydroxycarboxylates such as methyl 2-hydroxypropionate, ethyl 2-hydroxypropionate, methyl 2-methoxypropionate, ethyl 2-methoxypropionate and ethyl 2-ethoxypropionate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; halogenated hydrocarbons such as trichloroethylene; aromatic hydrocarbons such as toluene and xylene; and polar solvents such as dimethylacetamide, dimethylformamide, N-methylacetamide and N-methylpyrrolidone. These solvents may be used either singly or in any combination thereof. These solvents are used in an amount sufficient to uniformly dissolve the composition components used in the present invention.

In the resist composition of the present invention, may be contained one or more of additives compatible with the above components, such as a surfactant, storage stabilizer, sensitizer, anti-striation agent, plasticizer and anti-halation agent, as needed.

An aqueous solution of an alkali is generally used as a developer for the resist composition of this invention. As specific examples of the alkali, may be mentioned inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as diethylethanolamine and triethanolamine; and quaternary ammonium salts such as tetramethylammonium hydroxide, tetraethylammonium hydroxide, trimethylhydroxymethylammonium hydroxide, triethylhydroxymethylammonium hydroxide and trimethylhydroxyethylammonium hydroxide.

If necessary, suitable amounts of a water-soluble organic solvent such as methanol, ethanol, propanol or ethylene glycol, a surfactant, a storage stabilizer, a dissolution inhibitor for the resin and/or the like may be added further to the aqueous alkali solution.

Using the resist composition according to the present invention, a resist film can be formed by coating its solution in a solvent on the surface of a substrate such as a silicon wafer by a method known per se in the art and then drying the substrate to remove the solvent. As the coating method, spin coating can be recommended for use in particular. The exposure of the resist composition can be conducted by exposing it to active rays such as far ultraviolet radiation, KrF excimer laser beam or i-rays (365 nm), thereby forming a minute pattern. It is preferable to conduct a heat treatment (post-exposure bake) after the exposure because the reaction can be facilitated to further enhance the sensitivity and stability of the resist composition.

In the resist composition according to the present invention, the polymer (B) undergoes a change in solubility at the exposed area by the action of an acid derived from the compound (A) which forms the acid upon exposure to active rays. The resist composition according to the present invention serves as a positive resist by using the alkaline developer.

The resist composition according to the present invention contains the phenolic compound (C), and hence can prevent the formation of a hardly-soluble layer on the surface of a resist pattern.

(Process for forming a resist pattern)

In order to form a resist pattern using the resist composition according to the present invention, there is used a process for forming a resist pattern, comprising the steps of coating of a chemically amplified resist to a substrate, the first heating treatment, exposure to active rays, the second heating treatment and development in order. According to the process of the present invention for forming a resist pattern, the formation of a hardly-soluble layer on the surface of the resist pattern can be prevented, and so the sectional form of patterned lines is improved. In addition, fine patterned lines can be obtained even when using a substrate having a difference in level at its surface of 10 nm or more.

ADVANTAGES OF THE INVENTION

According to the present invention, there is provided a resist composition excellent in sensitivity, resolution, resistance to etching, storage stability, process latitude and the like and capable of preventing the formation of a hardly-soluble layer on the surface of a resist pattern formed from the resist composition. The resist composition according to this invention is particularly suited for using as a positive resist for minute processing of semiconductor elements. The present invention also provides a process for forming a resist pattern excellent in pattern form.

EMBODIMENTS OF THE INVENTION

The present invention will hereinafter be described more specifically by Examples. Incidentally, all designations of "part" or "parts" and "%" as will be used in the following examples mean part or parts by weight and wt. % unless otherwise noted.

EXAMPLE 1

| | |
|---|---|
| (1) Copolymer of Compound (8) and 4-hydroxystyrene (Mw = 6,500, molar ratio of the comonomers = 48/52) | 100 parts |
| (2) Triphenylsulfonium triflate | 5 parts |
| (3) Additive shown in Table 1 | 10 parts |
| (4) Fluorocarbon surfactant | 0.01 part |
| (5) Propylene glycol monomethyl ether acetate | 380 parts |

The above components were mixed into a solution. The resulting solution was filtered through a polytetrafluoroethylene filter (Teflon filter manufactured by Nihon Millipore LTD.) having a pore size of 0.1 µm to prepare a resist solution. After coating the resist solution on a silicon wafer by a spinner, the resist solution was baked for 90 seconds at 110° C., thereby forming a resist film having a thickness of 1.0 µm.

The silicon wafer on which the resist film had been formed was exposed by means of a KrF excimer laser stepper, "NSR1755EX8A" (manufactured by Nikon Corp., NA=0.45). After the thus-exposed silicon wafer was left over for 20 minutes, post-exposure bake was effected for 60 seconds at 90° C. The thus-baked film was then developed by immersion developing in an aqueous solution (concentration: 2.38%) of tetramethylammonium hydroxide for 1 minute at 23° C., thereby obtaining a resist pattern.

The wafer with the pattern formed thereon was taken out of the aqueous solution to observe it through an electron microscope. The results are shown in Table 1. In the resists (Run Nos. 1 to 7) according to the present invention, to which their corresponding phenolic compounds shown in Table 1 were separately added as an additive, the formation of a hardly-soluble surface layer was scarcely observed, and the resolution was also better than the resist (Run No. 8) added with no additive.

TABLE 1

| Run No. | Additive | Resolution (µm) | Formation of hardly-soluble surface layer |
| --- | --- | --- | --- |
| 1 | Pyrogallol | 0.30 | Not occurred |
| 2 | Bisphenol A | 0.35 | Not occurred |
| 3 | Trisphenol PA | 0.35 | Slightly occurred |
| 4 | Trisphenol HAP | 0.30 | Slightly occurred |
| 5 | 2,3,4,4'-Tetrahydroxy-benzophenone | 0.30 | Not occurred |
| 6 | Dihydroxybiphenyl | 0.30 | Not occurred |
| 7 | 2,4-Dinitrophenol | 0.30 | Not occurred |
| 8 | Not added | 0.45 | Occurred |

EXAMPLE 2

| | |
| --- | --- |
| (1) Copolymer of Compound (47) and styrene (Mw = 12,400, molar ratio of the comonomers = 57/43) | 100 parts |
| (2) Triphenylsulfonium triflate | 5 parts |
| (3) Additive shown in Table 2 | 15 parts |
| (4) Fluorocarbon surfactant | 0.01 part |
| (5) Cyclohexanon | 430 parts |

The above components were mixed into a solution. The resulting solution was filtered through a polytetrafluoroethylene filter (Teflon filter manufactured by Nihon Millipore LTD.) having a pore size of 0.1 µm to prepare a resist solution. After coating the resist solution on a silicon wafer by a spinner, the resist solution was baked for 90 seconds at 110° C., thereby forming a resist film having a thickness of 0.7 µm.

The silicon wafer on which the resist film had been formed was exposed by means of a KrF excimer laser stepper, "NSR1755EX8A" (manufactured by Nikon Corp., NA=0.45), and post-exposure bake was immediately effected for 60 seconds at 90° C. The thus-baked film was then developed by immersion developing in the aqueous solution of tetramethylammonium hydroxide for 1 minute at 23° C. to evaluate the sensitivity of the resist.

Another silicon wafer was treated in the same manner as described above except that the silicon wafer on which the resist had been applied was exposed, and then subjected to post-exposure bake after left over for 20 minutes.

Each ratio, $E^1_{th}/E^0_{th}$ of the sensitivity ($E^1$th) when effecting the post-exposure bake after left over for 20 minutes to the sensitivity ($E^0_{th}$) when immediately effecting the post-exposure bake after the exposure was calculated out to show it in Table 2.

TABLE 2

| Run No. | Additive | Ratio of sensitivity $E^1_{th}/E^0_{th}$ |
| --- | --- | --- |
| 9 | Phloroglucinol | 1.05 |
| 10 | Bisphenol S | 1.10 |
| 11 | Trisphenol TC | 1.00 |
| 12 | Trisphenol HAP | 1.05 |
| 13 | 2,4,4'-Trihydroxy-benzophenone | 1.00 |
| 14 | Dihydroxybiphenyl | 1.10 |
| 15 | 2,6-Dinitrophenol | 1.00 |
| 16 | Not added | 1.85 |

(Note):
$E^0_{th}$: Sensitivity when immediately effecting the post-exposure bake after the exposure.
$E^1_{th}$: Sensitivity when effecting the post-exposure bake after left over for 20 minutes.

As apparent from the results shown in Table 2; it is understood that the resists (Run Nos. 9 to 15) according to the present invention, to which their corresponding phenolic compounds shown in Table 2 were separately added, were smaller in the variation of sensitivity than the resist (Run No. 16) added with no additive.

EXAMPLE 3

| | |
| --- | --- |
| (1) Copolymer of Compound (7) and styrene (Mw = 48,000, molar ratio of the comonomers = 48/52) | 100 parts |
| (2) Bis(t-butylphenylsulfonyl)-diazomethane | 5 parts |
| (3) Trisphenol TC | 15 parts |
| (4) Fluorocarbon surfactant | 0.01 part |
| (5) Propylene glycol monomethyl ether acetate | 350 parts |

The above components were mixed into a solution. The resulting solution was filtered through a polytetrafluoroethylene filter (Teflon filter manufactured by Nihon Millipore LTD.) having a pore size of 0.1 µm to prepare a resist solution. After coating the resist solution on a silicon wafer by a spinner, the resist solution was baked for 90 seconds at 110° C., thereby forming a resist film having a thickness of 1.0 µm.

The silicon wafer on which the resist film had been formed was exposed by means of a KrF excimer laser stepper, "NSR1755EX8A" (manufactured by Nikon Corp.; NA=0.45), and post-exposure bake was effected for 60 seconds at 90° C. The thus-baked film was then developed by immersion developing in the aqueous solution of tetramethylammonium hydroxide for 1 minute at 23° C., thereby obtaining a resist pattern.

The sensitivity of the resist was evaluated and was found to be 58 mJ/cm². The film thickness of the pattern was measured by a thickness meter, "Alpha-Step 200" (manufactured by Tenkor Inst.) and was found to be 0.92 µm. The wafer on which the pattern had been formed was taken out of the aqueous solution to observe it through an electron microscope. As a result, it was found that a pattern having a line width of 0.35 µm was resolved, and no hardly-soluble surface layer was observed.

EXAMPLE 4

| | |
|---|---|
| (1) Copolymer of Compound (46) and methyl methacrylate (Mw = 18,000, molar ratio of the comonomers = 50/50) | 100 parts |
| (2) Triphenylsulfonium triflate | 5 parts |
| (3) 2,4,4'-Trihydroxybenzophenone | 15 parts |
| (4) Fluorocarbon surfactant | 0.01 part |
| (5) Propylene glycol monomethyl ether acetate | 450 parts |

The above components were mixed into a solution. The resulting solution was filtered through a polytetrafluoroethylene filter (Teflon filter manufactured by Nihon Millipore LTD.) having a pore size of 0.1 μm to prepare a resist solution. After coating the resist solution on a silicon wafer by a spinner, the resist solution was baked for 90 seconds at 90° C., thereby forming a resist film having a thickness of 0.7 μm.

The silicon wafer on which the resist film had been formed was exposed by means of a KrF excimer laser stepper, "NSR1755EX8A" (manufactured by Nikon Corp., NA=0.45), and post-exposure bake was effected for 60 seconds at 90° C. The thus-baked film was then developed by immersion developing in the aqueous solution of tetramethylammonium hydroxide for 1 minute at 23° C., thereby obtaining a resist pattern.

The sensitivity of the resist was evaluated and was found to be 42 mJ/cm². The film thickness of the pattern was measured by a thickness meter, "Alpha-Step 200" (manufactured by Tenkor Inst.) and was found to be 0.63 μm. The wafer on which the pattern had been formed was taken out of the aqueous solution to observe it through an electron microscope. As a result, it was found that a pattern having a line width of 0.30 μm was resolved, and no hardly-soluble surface layer was observed.

EXAMPLE 5

| | |
|---|---|
| (1) Copolymer of Compound (65) and methyl methacrylate (Mw = 16,000, molar ratio of the comonomers = 51/49) | 100 parts |
| (2) Triphenylsulfonium triflate | 5 parts |
| (3) 2,4,4'-Trihydroxybenzophenone | 15 parts |
| (4) Fluorocarbon surfactant | 0.01 part |
| (5) Propylene glycol monomethyl ether acetate | 450 parts |

The above components were mixed into a solution. The resulting solution was filtered through a polytetrafluoroethylene filter (Teflon filter manufactured by Nihon Millipore LTD.) having a pore size of 0.1 μm to prepare a resist solution. After coating the resist solution on a silicon wafer by a spinner, the resist solution was baked for 90 seconds at 90° C., thereby forming a resist film having a thickness of 0.7 μm.

The silicon wafer on which the resist film had been formed was exposed by means of a KrF excimer laser stepper, "NSR1755EX8A" (manufactured by Nikon Corp., NA=0.45), and post-exposure bake was effected for 60 seconds at 90° C. The thus-baked film was then developed by immersion developing in the aqueous solution of tetramethylammonium hydroxide for 1 minute at 23° C., thereby obtaining a resist pattern.

The sensitivity of the resist was evaluated and was found to be 38 mJ/cm². The film thickness of the pattern was measured by a thickness meter, "Alpha-Step 200" (manufactured by Tenkor Inst.) and was found to be 0.65 μm. The wafer on which the pattern had been formed was taken out of the aqueous solution to observe it through an electron microscope. As a result, it was found that a pattern having a line width of 0.30 μm was resolved, and no hardly-soluble surface layer was observed.

Comparative Example 1

| | |
|---|---|
| (1) Copolymer of Compound (46) and 4-hydroxystyrene (Mw = 11,000, molar ratio of the comonomers = 50/50) | 100 parts |
| (2) Triphenylsulfonium triflate | 5 parts |
| (3) Fluorocarbon surfactant | 0.01 part |
| (4) Ethyl lactate | 450 parts |

The above components were mixed into a solution. The resulting solution was filtered through a polytetrafluoroethylene filter (Teflon filter manufactured by Nihon Millipore LTD.) having a pore size of 0.1 μm to prepare a resist solution. After coating the resist solution on a silicon wafer by a spinner, the resist solution was baked on a hot plate for 90 seconds at 110° C., thereby forming a resist film having a thickness of 0.7 μm.

The silicon wafer on which the resist film had been formed was exposed by means of 248 nm laser. After the exposure, the thus-exposed film was immediately baked on the hot plate for 60 second at 90° C., and developed by a puddle developing in an aqueous solution (concentration: 2.38%) of tetramethylammonium hydroxide for 60 seconds. The section of patterned lines of the resist layer was observed, and was found to be in a reverse tapered form like a canopy top (T shape) as illustrated in FIG. 1. 0.40 μm lines and spaces were resolved at intervals of 0.40 μm, and the size of top was about 0.60 μm.

EXAMPLE 6

| | |
|---|---|
| (1) Copolymer of Compound (46) and 4-hydroxystyrene (Mw = 11,000, molar ratio of the comonomers = 50/50) | 100 parts |
| (2) Triphenylsulfonium triflate | 5 parts |
| (3) Fluorocarbon surfactant | 0.01 part |
| (4) Ethyl lactate | 450 parts |
| (5) 2,4,4'-Trihydroxybenzophenone | 10 parts |

The above components were mixed into a solution. The resulting solution was filtered through a polytetrafluoroethylene filter (Teflon filter manufactured by Nihon Millipore LTD.) having a pore size of 0.1 μm to prepare a resist solution. After coating the resist solution on a silicon wafer by a spinner, the resist solution was baked on a hot plate for 90 seconds at 110° C., thereby forming a resist film having a thickness of 0.7 μm.

Figure 2:
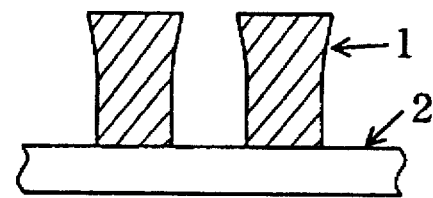
FIG. 2 is a typical cross-sectional view illustrating patterned lines of a resist layer formed in Example 6. In both drawings, numeral 1 indicates a patterned line in section, while numeral 2 designates a substrate in section.

The silicon wafer on which the resist film had been formed was exposed by means of 248 nm laser. After the exposure, the thus-exposed film was immediately heat-treated on the hot plate for 60 second at 90° C., and developed by a puddle process in an aqueous solution (concentration: 2.38%) of tetramethylammonium hydroxide for 60 seconds. The section of patterned lines of the resist layer was observed, and was found to have a good pattern form as illustrated in FIG. 2. 0.40 μm lines and spaces were resolved, and the size of top was less than 0.45 μm.

Comparative Example 2

| | |
|---|---|
| (1) Copolymer of Compound (46) and 4-hydroxystyrene (Mw = 11,000, molar ratio of the comonomers = 50/50) | 100 parts |
| (2) Triphenylsulfonium triflate | 5 parts |
| (3) Fluorocarbon surfactant | 0.01 part |
| (4) Ethyl lactate | 450 parts |

The above components were mixed into a solution. The resulting solution was filtered through a polytetrafluoroethylene filter (Teflon filter manufactured by Nihon Millipore LTD.) having a pore size of 0.1 μm to prepare a resist solution. After coating the resist solution by a spinner on a substrate having 100 nm steps at its surface, the resist solution was baked on a hot plate for 90 seconds at 110° C., thereby forming a resist film having a thickness of 0.7 μm.

Figure 3:
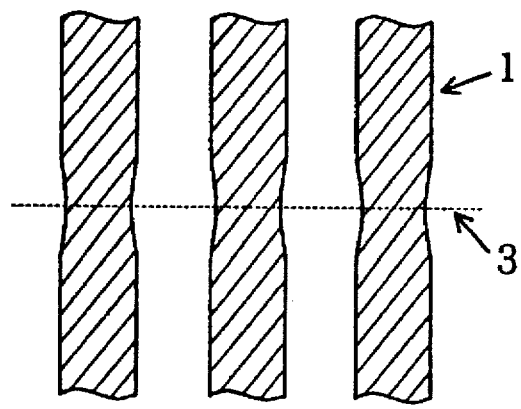
FIG. 3 is a typical plan view illustrating patterned lines of a resist layer formed in Comparative Example 2.

The substrate on which the resist film had been formed was exposed by means of 248 nm laser. After the exposure, the thus-exposed film was immediately baked on the hot plate for 60 second at 90° C., and developed by a puddle developing in an aqueous solution (concentration: 2.38%) of tetramethylammonium hydroxide for 60 seconds. The surface of patterned lines of the resist pattern was observed. As a result, it was confirmed that the width of lines extending across the steps varied by about 20% near the steps as illustrated in FIG. 3. This is considered to be attributable to halation due to the steps on the substrate.

EXAMPLE 7

| | |
|---|---|
| (1) Copolymer of Compound (46) and 4-hyroxystyrene (Mw = 11,000, molar ratio of the comonomers = 50/50) | 100 parts |
| (2) Triphenylsulfonium triflate | 5 parts |
| (3) Fluorocarbon surfactant | 0.01 part |
| (4) Ethyl lactate | 450 parts |
| (5) 2,4,4'-Trihydroxybenzophenone | 10 parts |

The above components were mixed into a solution. The resulting solution was filtered through a polytetrafluoroethylene filter (Teflon filter manufactured by Nihon Millipore LTD.) having a pore size of 0.1 μm to prepare a resist solution. After coating the resist solution by a spinner on a substrate having 100 nm steps at its surface, the resist solution was baked on a hot plate for 90 seconds at 110° C., thereby forming a resist film having a thickness of 0.7 μm.

Figure 4:
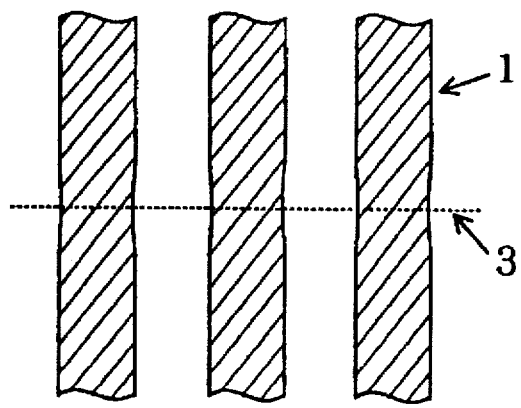
FIG. 4 is a typical plan view illustrating patterned lines of a resist layer formed in Example 7. In both drawings, numeral 1 indicates a patterned line in plan, while numeral 3 designate a portion of a substrate at which a difference in level is situated.

The substrate on which the resist film had been formed was exposed by means of 248 nm laser. After the exposure, the thus-exposed film was. immediately baked on the hot plate for 60 second at 90° C., and developed by a puddle developing in an aqueous solution (concentration: 2.38%) of tetramethylammonium hydroxide for 60 seconds. The surface of patterned lines of the resist pattern was observed. As a result, it was confirmed that the width of lines extending across the step slightly varied near the step as illustrated in FIG. 4. However, the degree of the variation was 5% or less. This is considered to be attributable to the fact that halation due to the step on the substrate is reduced.

We claim:

1. A resist composition comprising in admixture:

(A) a compound which forms an acid upon exposure to active rays, in an amount of 0.01-50 parts by weight per 100 parts by weight of a component (B);

(B) 100 parts by weight of a polymer which has at least one structural unit with a group unstable to an acid and cleaves at this group in the presence of the acid derived from the compound (A) to turn alkali-soluble and contains, as the structural unit with a group unstable to an acid, at least one structural unit selected from the group consisting of structural units represented by the following formulae (I), (II) and (III):

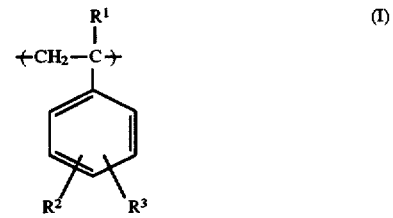

wherein $R^1$ and $R^2$ are identical with or different from each other, and mean individually a hydrogen atom, a halogen atom, a cyano group, an alkyl group having 1–5 carbon atoms or a substituted alkyl group having 1–5 carbon atoms and a halogen atom as a substituent, and $R^3$ denotes a linear acetal group, a cyclic acetal group, a carbonate group or —$OR^9$, in which $R^9$ is

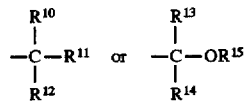

in which $R^{10}$, $R^{11}$, $R^{12}$, $R^{13}$, $R^{14}$ and $R^{15}$ are independently selected from linear alkyl groups, substituted linear alkyl groups having a halogen atom as a substituent, branched alkyl groups, substituted branched alkyl groups having a halogen atom as a substituent, cycloalkyl groups, substituted cycloalkyl groups having a halogen atom as a substituent, alkenyl groups, substituted alkenyl groups having a halogen atom as a substituent, aryl groups, substituted aryl groups having a halogen atom or a nitro group as a substituent, aralkyl groups and substituted aralkyl groups having a halogen atom or a nitro group as a substituent, or $R^{13}$ and $R^{14}$ may each be a hydrogen atom;

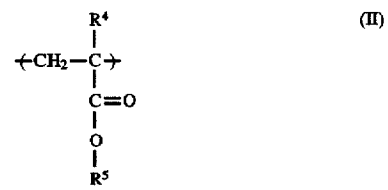

wherein $R^4$ means a hydrogen atom, a halogen atom, a cyano group, an alkyl group having 1–5 carbon atoms or a substituted alkyl group having 1–5 carbon atoms and a halogen atom as a substituent, and $R^5$ is

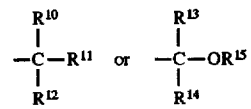

in which $R^{10}$, $R^{11}$, $R^{12}$, $R^{13}$, $R^{14}$ and $R^{15}$ are independently selected from linear alkyl groups, substituted linear alkyl groups having a halogen atom as a substituent, branched alkyl groups, substituted branched alkyl groups having a halogen atom as a substituent, cycloalkyl groups, substituted cycloalkyl groups having a halogen atom as a substituent, alkenyl groups, substituted alkenyl groups having a halogen atom as a substituent, aryl groups, substituted aryl groups having a halogen atom or a nitro group as a substituent, aralkyl groups and substituted aralkyl groups having a halogen atom or a nitro group as a substituent, or $R^{13}$ and $R^{14}$ may each be a hydrogen atom; and

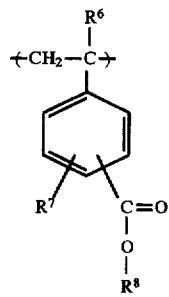
(III)

wherein $R^6$ and $R^7$ mean individually a hydrogen atom, a halogen atom, a cyano group, an alkyl group having 1–5 carbon atoms or a substituted alkyl group having 1–5 carbon atoms and a halogen atom as a substituent, and $R^8$ is

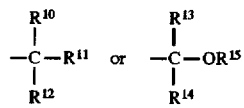

in which $R^{10}$, $R^{11}$, $R^{12}$, $R^{13}$, $R^{14}$ and $R^{15}$ are independently selected from linear alkyl groups, substituted linear alkyl groups having a halogen atom as a substituent, branched alkyl groups, substituted branched alkyl groups having a halogen atom as a substituent, cycloalkyl groups, substituted cycloalkyl groups having a halogen atom as a substituent, alkenyl groups, substituted alkenyl groups having a halogen atom as a substituent, aryl groups, substituted aryl groups having a halogen atom or a nitro group as a substituent, or $R^{13}$ and $R^{14}$ may each be a hydrogen atom; and (C) at least one phenolic compound selected from the group consisting of phenols, bisphenols, trisphenols, tetrakisphenols, hydroxybenzophenones, hydroxybiphenyls, hydroxybenzophenone oximes, hydroxybenzotriazoles, hydroxyacetophenones, gallic acid, hydroxystyrenes, hydroxystyrene oligomers, hydroxy-α-methylstyrenes, hydroxy-α-methylstyrene oligomers, novolak oligomers, chromones, flayones, flavonols, flavanones, oxyflavanones, isoflavans, chromans, catechins, spirobichromans, nitrophenols, cyanophenols, alkoxyphenols, halogenated phenols, and derivatives thereof, in an amount of 0.01–100 parts by weight per 100 parts by weight of the component (B); and (D) a solvent in an amount sufficient to uniformly dissolve the components (A), (B) and (C), said resist composition being positive working when developed with alkaline developer.

2. The resist composition according to claim 1, wherein the component (C) is at least one compound selected from the group consisting of phenols, bisphenols, trisphenols, hydroxybenzophenones, hydroxybiphenyls, nitrophenols, halogenated phenols, and derivatives thereof.

3. The resist composition according to claim 1, wherein the component (B) is a copolymer of at least one monomer (a) selected from the group consisting of compounds represented by the following general formulae (IV), (V) and (VI):

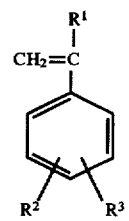
(IV)

wherein $R^1$, $R^2$ and $R^3$ have the same meaning as define in the general formula (I);

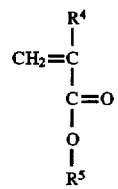
(V)

wherein $R^4$ and $R^5$ have the same meaning as define in the general formula (II); and

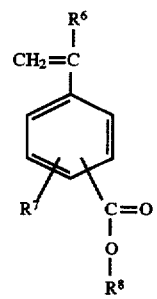
(VI)

wherein $R^6$, $R^7$ and $R^8$ have the same meaning as define in the general formula (III), with at least one monomer (b) selected from the group consisting of styrene compounds, acrylic compounds, methacrylic compounds, acrylic amide compounds, methacrylic amide compounds, maleic compounds, maleic anhydride compounds, vinyl acetate, vinylpyrrolidine, acrylonitrile, fumaronitrile, vinylpyrrolidone and vinylcarbazole.

4. The resist composition according to claim 3, wherein the component (B) is a copolymer of 30–80 mol % of the monomer (a) with 20–70 mol % of the monomer (b).

5. The resist composition according to claim 3, wherein the weight average molecular weight of the copolymer falls within a range of 1,000–1,000,000.

6. The resist composition according to claim 3, wherein the component (B) is a copolymer of at least one monomer (a) selected from the compounds represented by the general formulae (IV), (V) and (VI) with at least one monomer selected from the group consisting of styrene, 4-hydroxystyrene and methyl methacrylate.

7. The resist composition according to claim 6, wherein the component (B) is a copolymer of a compound of the following chemical formula:

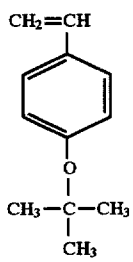

with 4-hydroxystyrene.

8. The resist composition according to claim 6, wherein the component (B) is a copolymer of a compound of the following chemical formula:

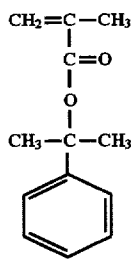

with styrene.

9. The resist composition according to claim 6, wherein the component (B) is a copolymer of a compound of the following chemical formula:

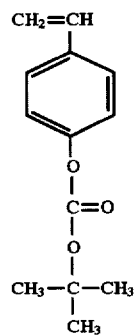

with styrene.

10. The resist composition according to claim 6, wherein the component (B) is a copolymer of a compound of the following chemical formula:

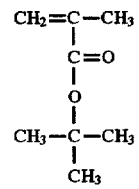

with methyl methacrylate.

11. The resist composition according to claim 6, wherein the component (B) is a copolymer of a compound of the following chemical formula:

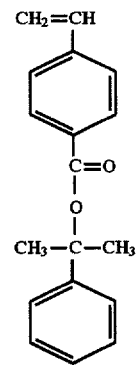

with methyl methacrylate.

12. The resist composition according to claim 6, wherein the component (B) is a copolymer of a compound of the following chemical formula:

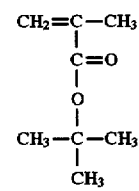

with 4-hydroxystyrene.

13. The resist composition according to claim 1, wherein the component (A) is at least one compound selected from the group consisting of onium salts, halogenated organic compounds, quinonediazide compounds, α,α'-bis(sulfonyl) diazomethane compounds, α-carbonyl-α'-sulfonyl-diazomethane compounds, sulfone compounds, organic acid ester compounds, organic acid amide compounds and organic acid imide compounds.

* * * * *

UNITED STATES PATENT AND TRADEMARK OFFICE
CERTIFICATE OF CORRECTION

PATENT NO. : 5,688,628
DATED :  November 18, 1997
INVENTOR(S) : Masayuki OIE et al.

It is certified that error appears in the above-identified patent and that said Letters Patent is hereby corrected as shown below:

On the title page, item [73] should read as follows:
--[73]  Assignee: NIPPON ZEON CO., LTD., Tokyo, Japan and FUJITSU LIMITED, Kanagawa, Japan--

Signed and Sealed this

Third Day of August, 1999

Attest:

Attesting Officer

Q. TODD DICKINSON

Acting Commissioner of Patents and Trademarks